United States Patent
Qin et al.

(10) Patent No.: US 6,602,738 B2
(45) Date of Patent: Aug. 5, 2003

(54) METHOD OF MANUFACTURING SEMICONDUCTOR DEVICE HAVING TIE BARS FOR INTERCONNECTING LEADS

(75) Inventors: Zhikang Qin, Tokyo (JP); Namiki Moriga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/241,294

(22) Filed: Sep. 12, 2002

(65) Prior Publication Data

US 2003/0096455 A1 May 22, 2003

(30) Foreign Application Priority Data

Sep. 26, 2001 (JP) .................................. 2001-293418
Jul. 15, 2002 (JP) .................................. 2002-205774

(51) Int. Cl.⁷ .................... H01L 21/44; H01L 21/48; H01L 21/50
(52) U.S. Cl. .................... 438/123; 438/111; 438/12; 438/124

(58) Field of Search ................... 438/123, 111, 438/112, 124

(56) References Cited

U.S. PATENT DOCUMENTS

| | | | | |
|---|---|---|---|---|
| 5,776,798 A | * | 7/1998 | Quan et al. ................. | 438/112 |
| 6,194,247 B1 | * | 2/2001 | Burns et al. ................ | 438/107 |
| 6,399,423 B2 | * | 6/2002 | Matsuura et al. ........... | 438/123 |

FOREIGN PATENT DOCUMENTS

| | | |
|---|---|---|
| JP | 5-206177 | 8/1993 |
| JP | 8-250523 | 9/1996 |

* cited by examiner

Primary Examiner—Kamand Cuneo
Assistant Examiner—David A. Zarneke
(74) Attorney, Agent, or Firm—McDermott, Will & Emery

(57) ABSTRACT

A semiconductor element is first fixed on a frame. The semiconductor element and a plurality of leads are connected together. The semiconductor element is sealed with molding resin, to thereby fabricate a package having a length per side of 14 mm or more. After tie bars interconnecting a plurality of leads have been cut, a package is subjected to heat treatment at a predetermined temperature.

9 Claims, 8 Drawing Sheets

*Fig. 11*   Related-Art
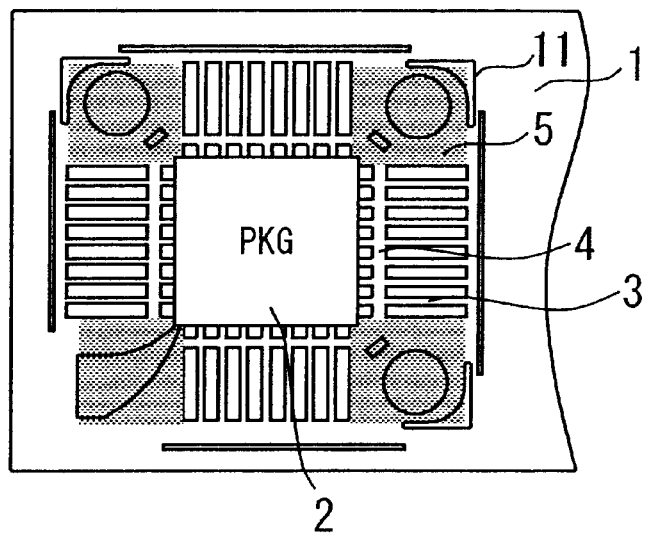
*Fig. 12*   Related-Art
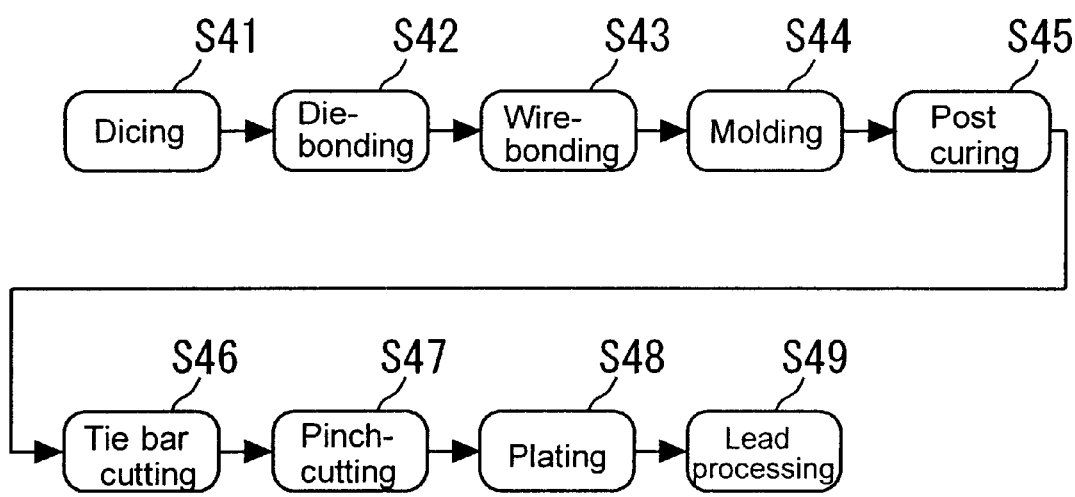

METHOD OF MANUFACTURING SEMICONDUCTOR DEVICE HAVING TIE BARS FOR INTERCONNECTING LEADS

BACKGROUND OF THE INVENTION

1. Field of the Invention

The present invention relates to a method of manufacturing a semiconductor device having leads, and more particularly, to an improvement in the flatness of leads.

2. Description of the Background Art

FIG. 11 is a view for describing a related-art semiconductor device. In FIG. 11, reference numeral 1 designates a frame; 2 designates a package in which a semiconductor element is sealed with resin; 3 designates a lead; 4 designates a tie bar for interconnecting a plurality of leads 3; and 5 designates a pinch-cutting section connecting a corner section of the package 2 to a framework 11.

A related-art method of manufacturing a semiconductor device will now be described.

FIG. 12 is a view for describing a related-art method of manufacturing a semiconductor device (i.e., an assembly flow method).

First, a semiconductor element having been diced (step S41) is die-bonded to a die pad of the frame 1 (step S42).

Next, the semiconductor element and the leads 3 are wire-bonded by means of gold wires (step S43).

The semiconductor element is then sealed with molding resin (step S44), thereby forming the package 2.

The package 2 is subjected to heat treatment (i.e., post curing treatment), thereby completing hardening of the molding resin (step S45).

The tie bar 4 is cut (tie bar cutting operation) (step S46), and the pinch cutting sections 5 are cut (pinch-cutting operation) (step S47).

The leads 3 are plated (step S48) and subjected to processing (step S49).

Upsizing of a package is continually pursued in association with an improvement in functions of the package, an increase in the number of pins, an increase in the number of rows, and a decrease in thickness of the package, and there exists a demand for making leads of a package flat. Flatness of leads is strongly demanded for improving packing yields of, particularly, a thin quad flat package (TQFP)/low-profile quad flat package (LQFP).

However, the related-art manufacturing method suffers from a problem of flatness failure arising at a rate as high as 1 to 3% after completion of the lead processing operation (step S49). Particularly, there may sometimes arise a case where lead flatness failure arises sporadically at a rate up to 30% in a large-sized package such as a TQFP/LQFP.

A warped section A arising in a package after completion of post curing of a mold (step S45), as shown in FIG. 13, is one reason for occurrence of such a flatness failure. The warpage arises as a result of free expansion of the package 2 for reasons of a difference in coefficient of heat expansion between molding resin and frame material when the hot package 2 is cooled to room temperature after post curing of mold.

FIG. 14 is a graph showing a relationship between warpage of a package and the flatness of leads. As shown in FIG. 14, as the degree of warpage of a package increases, the flatness of leads deteriorates. In order to improve the flatness of leads, the warpage of a package must be reduced.

FIG. 15 is a graph showing a relationship between occurrence of warpage and the size of a package. As shown in FIG. 15, when one side of the package assumes a length of 14 mm or more, warpage assumes a maximum value of 100 μm or more. When one side of the package assumes a length of 14 mm or more, warpage increases abruptly, and the flatness of leads deteriorates. Therefore, a mounting yield of a semiconductor device deteriorates.

As mentioned, in the case of a large-sized package having a length per side of 14 mm or more, warpage of the package must be reduced.

SUMMARY OF THE INVENTION

The present invention has been conceived to solve the previously-mentioned problems and a general object of the present invention is to provide a novel and useful method of manufacturing a semiconductor device.

A more specific object of the present invention is to provide a semiconductor device having superior lead flatness, by means of diminishing warpage of a package.

The above object of the present invention is attained by a following method of manufacturing a semiconductor device.

According to an aspect of the present invention, in the method of manufacturing a semiconductor device, a semiconductor element is first fixed on a frame. The semiconductor element is connected with a plurality of leads. The semiconductor element is sealed with molding resin, to thereby fabricate a package having a length per side of 14 mm or more. Tie bars interconnecting the plurality of leads are cut. The package is subjected to heat treatment at a predetermined temperature after cutting of the tie bars. Accordingly, warpage of the package can be reduced.

Other objects and further features of the present invention will be apparent from the following detailed description when read in conjunction with the accompanying drawings.

BRIEF DESCRIPTION OF THE DRAWINGS

FIG. 11 is a view for describing a related-art semiconductor device;

FIG. 12 is a view for describing a related-art method of manufacturing a semiconductor device;

DETAILED DESCRIPTION OF THE PREFERRED EMBODIMENTS

Figure 1:
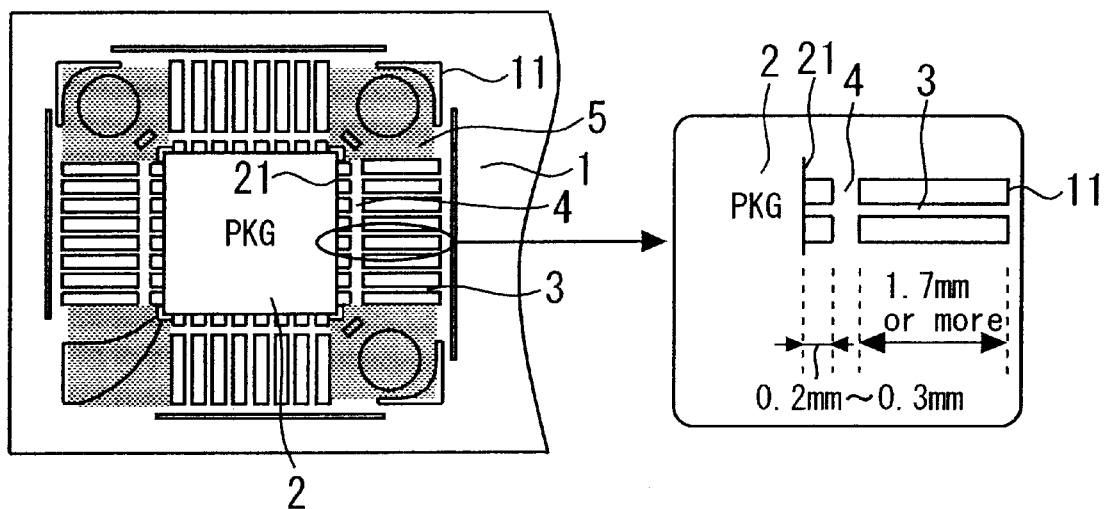
FIG. 1 is a view for describing a semiconductor device, before tie bar cutting, according to a first embodiment of the invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a view for describing a semiconductor device according to a first embodiment of the invention. In FIG. 1, reference numeral 1 designates a frame (lead frame); 11 designates a framework; 2 designates a package in which a semiconductor element is sealed with molding resin and whose length per side is 14 mm or more; 21 designates a mold line; 3 designates leads connected to the semiconductor element with gold wires; 4 designates a tie bar for linking together the plurality of leads 3; and 5 designates a pinch-cutting section for connecting a corner section of the package 2 to the lead framework 11.

As shown in FIG. 1, the frame 1 is formed from material which consists of copper or iron possessing a desired coefficient of heat expansion as a primary constituent. The package 2 is a large-sized package; for example, a thin quad flat package (TQFP) or a low-profile quad flat package (LQFP). The upper limit imposed on the size of the package 2 is set to the size (length) commonly possessed by a known package.

The tie bars 4 are for preventing leakage of resin, which would otherwise arise when molding resin is injected, and are arranged in parallel with the mold line 21. The tie bars 4 are formed so as to be spaced 0.2 mm to 0.3 mm away from the mold line 21. Further, the tie bars 4 are formed in positions spaced 1.7 mm or more away from the framework 11.

Figure 2:
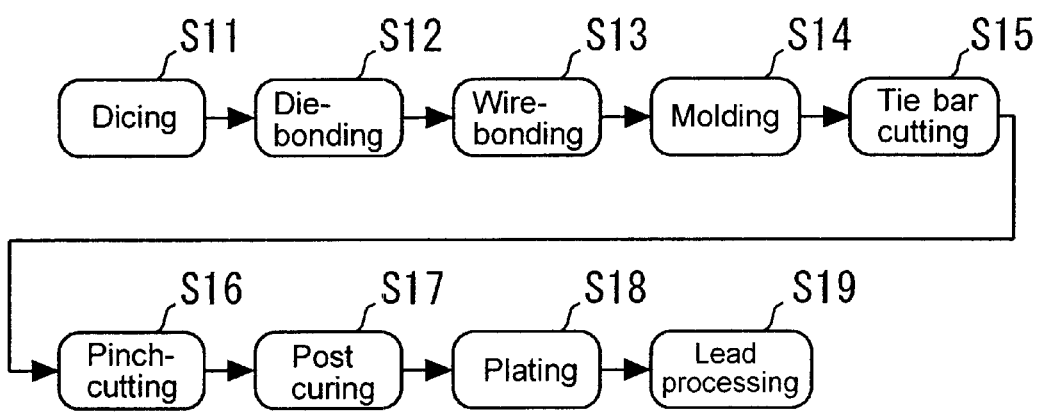
FIG. 2 is a view for describing a method of manufacturing a semiconductor device according to a first embodiment of the invention.

FIG. 2 is a view for describing a method of manufacturing a semiconductor device (i.e., an assembly flow method) according to a first embodiment of the invention.

First, a semiconductor substrate having undergone predetermined treatment is diced to form a semiconductor element (step S11). Next, the thus-diced semiconductor element is die-bonded onto a die pad of the frame 1 (step S12).

The semiconductor element and the leads 3 provided on the frame 1 are bonded together by way of gold wires through wire-bonding (step S13).

The semiconductor element is then sealed with molding resin (step S14), whereby the package 2 is fabricated on the frame 1.

The tie bars 4 which are provided in parallel with the mold line 21 of the package 2 and interconnect a plurality of leads 3 are cut (step S15), whereby the leads 3 are separated from and become independent of each other.

The pinch cutting sections 5 connecting the corners of the package 2 with the framework 11 are cut (step S16).

The package 2 is subjected to heat treatment (post curing treatment) at a temperature of 175° C.±10° C., thus completing hardening of molding resin (step S17).

The surfaces of the leads 3 are plated with solder (i.e., sheathing, outer plating) (step S18).

Figure 3:
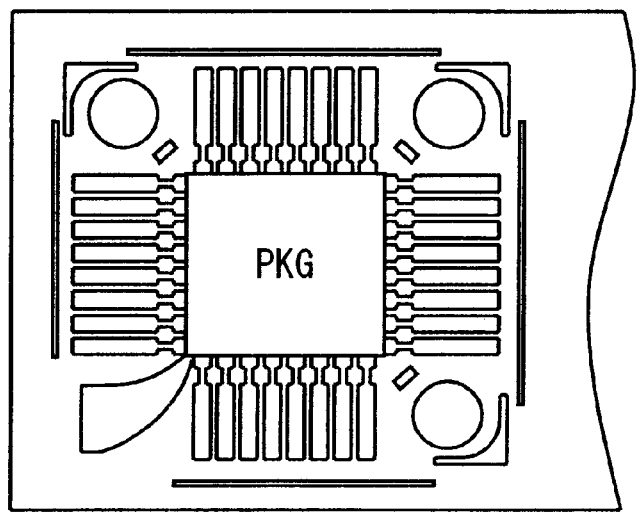
FIG. 3 is a view for describing a semiconductor device according to a first embodiment of the invention.
Figure 4:
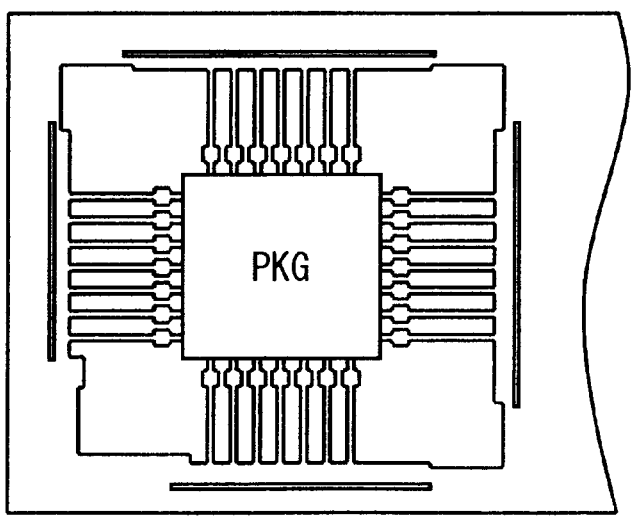
FIG. 4 is a view for describing a semiconductor device according to a first embodiment of the invention.

Finally, the leads 3 are subjected to processing (step S19), whereby a semiconductor device as shown in FIG. 3 or 4 is manufactured.

As has been described, under the method of manufacturing a semiconductor device according to the first embodiment, a semiconductor element is molded, and the tie bars 4 are cut. Subsequently, the semiconductor device is subjected to heat treatment (post curing treatment). By means of the method, the package 2 can be brought, before heat treatment, into a state in which internal stress of the package 2 can be alleviated; that is, a state in which the package 2 is subjected to fewer constraints. Hence, the stress arising in the package 2 for reasons of molding can be reduced by heat treatment (post curing treatment) in a state in which the package 2 is subjected to fewer constraints. Moreover, the package 2 can be cooled to room temperature with fewer constraints.

Accordingly, warpage of the package 2 can be reduced, thereby enabling an improvement in the flatness of leads of the package 2. Hence, a highly-reliable semiconductor device can be manufactured, thus enabling an improvement in mounting yield.

In the first embodiment, a curing temperature is set to 175° C.±10° C. As a result of the package 2 being cured at this temperature, the stress having arisen in the package 2 at the time of molding operation can be fully alleviated.

In the first embodiment, the pinch cutting sections 5 are cut after cutting of the tie bars 4 and before the package 2 is subjected to heat treatment. As a result, internal stress of the package 2 can be further reduced by means of heat treatment. Consequently, the package 2 can be cooled to room temperature with fewer constraints further.

In the first embodiment, the tie bars 4 are formed in positions spaced 0.2 mm to 0.3 mm away from the mold line 21. The closer the mold line 21 to the tie bars 4 become, the more apt warpage is to arise in the package 2. As a result, the effect of the invention becomes greater. The tie bars 4 are formed in positions 0.2 mm to 0.3 mm away from the mold line 21 in the manner as mentioned previously, in consideration of the positional accuracy of a tie bar cutting metal die and the positional accuracy of a molding die (the same also applies to corresponding portions in a second embodiment to be described later).

In the first embodiment, the tie bars 4 are formed in positions spaced 1.7 mm away from the framework 11. The longer a distance between the tie bars 4 and the framework 11, the less the package 2 becomes apt to constraints stemming from the geometry of a frame. Hence, warpage becomes less apt to arise. However, in consideration of the length of outer leads and the machining precision of leads, the tie bars 4 are formed in positions spaced 1.7 mm or more away from the framework 11 in the manner mentioned previously (the same also applies to corresponding portions of the second embodiment).

Figure 5:
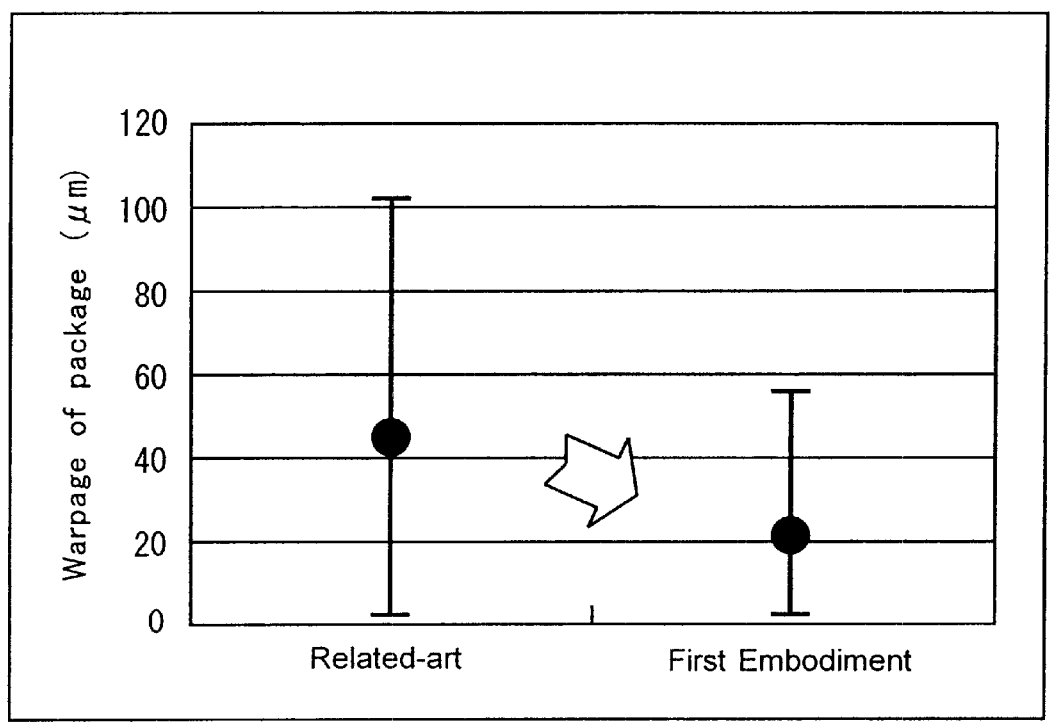
FIG. 5 is a plot showing a comparison between a measured result of warpage of the package described in connection with the first embodiment and a measured result of warpage of the related-art package.
Figure 6:
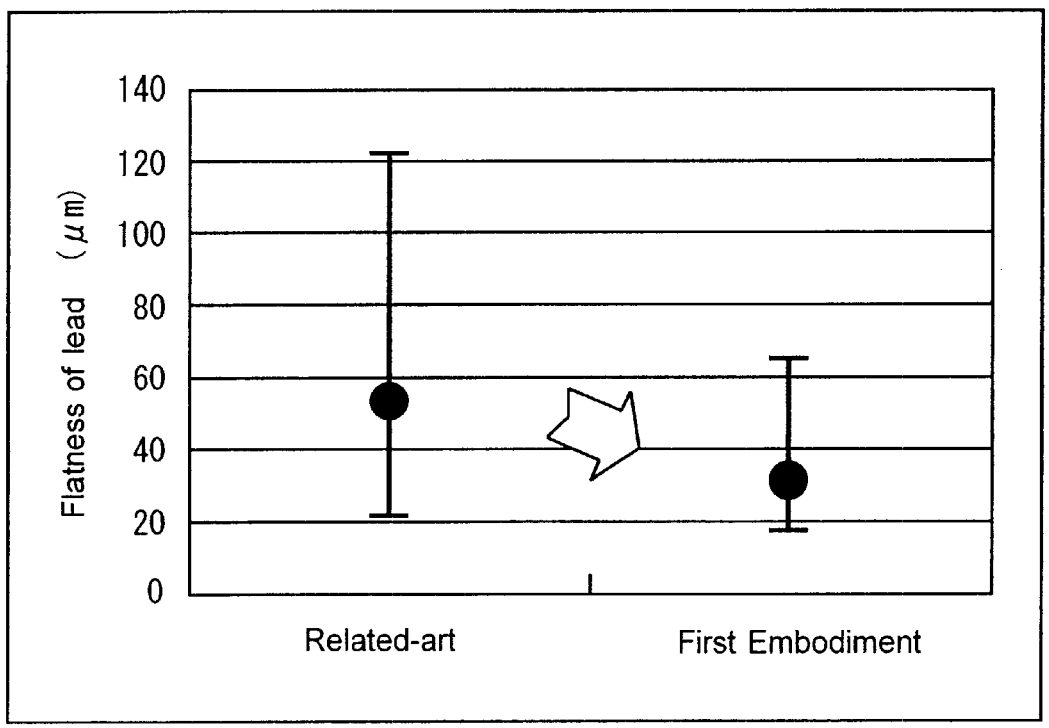
FIG. 6 is a plot showing a comparison between a measured result of flatness of leads of the package described in connection with the first embodiment and a measured result of flatness of leads of the related-art package.

An LQPFP having a length per side of 24 mm was actually produced according to the foregoing manufacturing method. Warpage in the thus-produced package and the flatness of leads of the package were measured. Table 1 and FIGS. 5 and 6 show results of measurement. FIG. 5 is a plot showing a comparison between a measured result of warpage of the package described in connection with the first embodiment and a measured result of warpage of the related-art package. FIG. 6 is a plot showing a comparison between a measured result of flatness of leads of the package described in connection with the first embodiment and a measured result of flatness of leads of the related-art package.

TABLE 1

| MANUFACTURING | WARPAGE ($\mu$m) | | | LEAD FLATNESS ($\mu$m) | | |
|---|---|---|---|---|---|---|
| METHOD | Max | Ave | Min | Max | Ave | Min |
| RELATED-ART METHOD | 102 | 44 | 2 | 121 | 53 | 20 |
| FIRST EMBODIMENT | 55 | 21 | 1 | 65 | 31 | 17 |

As shown in Table 1 and FIG. 5, as compared with the related-art manufacturing method, the manufacturing method according to the first embodiment has enabled an approximate 50% reduction in warpage of a package.

As shown in Table 1 and FIG. 6, as compared with the related-art manufacturing method, the manufacturing method according to the first embodiment has enabled an approximate 40% reduction in lead flatness.

Accordingly, the manufacturing method according to the first embodiment has enabled a reduction of warpage in a package and manufacture of a semiconductor device which is superior in the flatness of leads.

In the first embodiment, the pinch cutting sections 5 are cut after cutting of the tie bars 4. However, the pinch cutting sections 5 may be cut simultaneously with cutting of the tie bars 4.

Second Embodiment

A semiconductor device according to a second embodiment of the invention is substantially identical with that described in connection with the first embodiment, and therefore its repeated explanation is omitted. Those elements which are identical with or correspond to those employed in the first embodiment are assigned reference numerals that are identical with those employed in the first embodiment.

Figure 7:
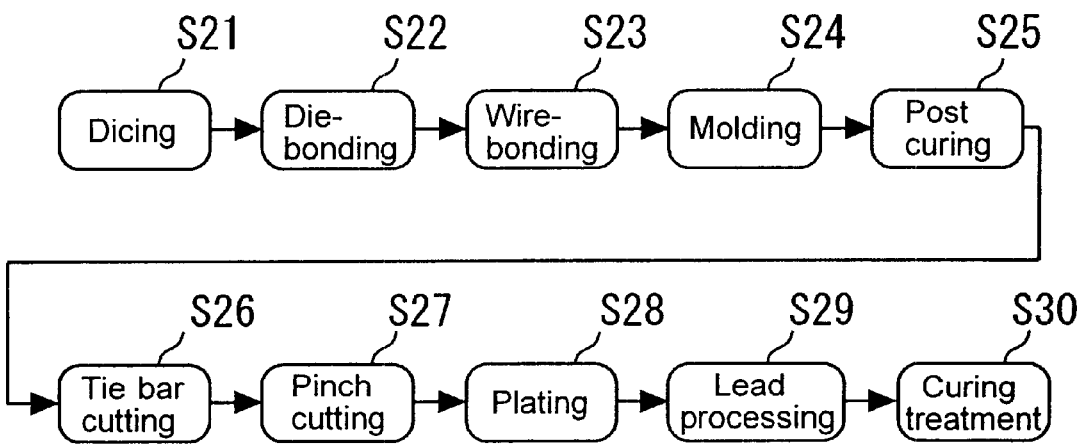
FIG. 7 is a view showing a method of manufacturing a semiconductor device according to the second embodiment of the invention.

FIG. 7 is a view showing a method of manufacturing a semiconductor device according to the second embodiment of the invention (an assembly flow method).

First, a semiconductor substrate having undergone predetermined treatment is diced to form a semiconductor element (step S21). Next, the thus-diced semiconductor element is die-bonded onto a die pad of the frame 1 (step S22).

The semiconductor element and the leads 3 provided on the frame 1 are bonded together by way of gold wires through wire-bonding (step S23).

Figure 8:
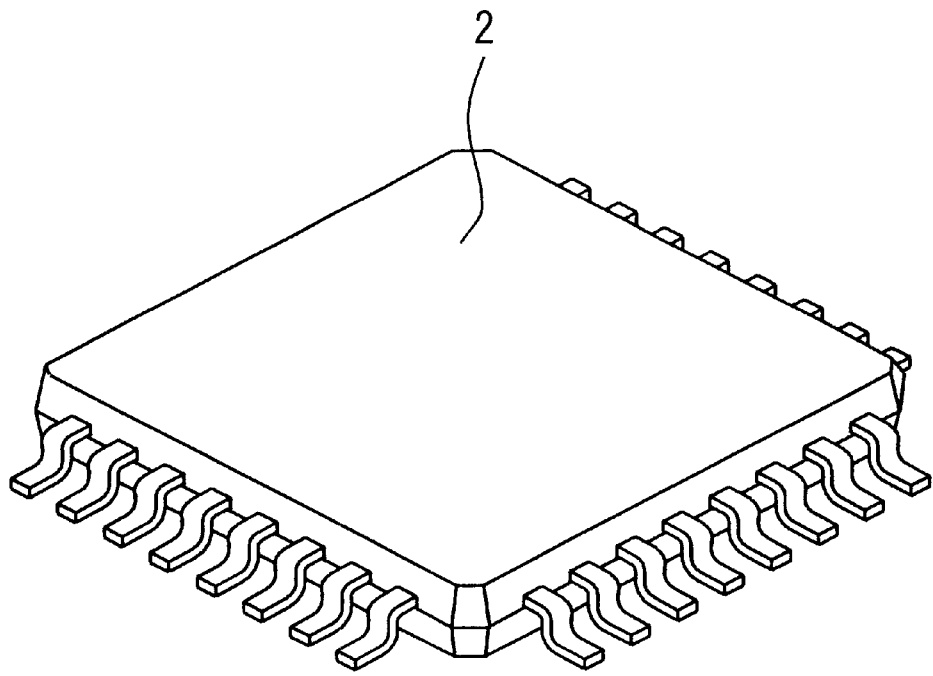
FIG. 8 is a view for describing a package in which a semiconductor element is sealed with molding resin.

The semiconductor element is then sealed with molding resin (step S24), whereby the package 2, such as that shown in FIG. 8, is fabricated on the frame 1. Thus far, the manufacturing method is identical with that described in connection with the first embodiment.

The package 2 is subjected to heat treatment (post curing treatment), thus completing hardening of molding resin (step S25). The heat treatment is intended only for hardening molding resin and not for alleviating internal stress of the package 2.

The tie bars 4 which are provided in parallel with the mold line 21 of the package 2 and interconnect the plurality of leads 3 are cut (step S26), whereby the leads 3 are separated from and become independent of each other.

The pinch cutting sections 5 connecting the corners of the package 2 with the framework 11 are cut (step S27).

The surfaces of the leads 3 are plated with solder (i.e., sheathing, outer plating) (step S28).

The leads 3 are subjected to further processing (step S29).

Finally, a single product is subjected to heat treatment (curing treatment) at a temperature of 100° C. to 140° C. (step S30).

Figure 9:
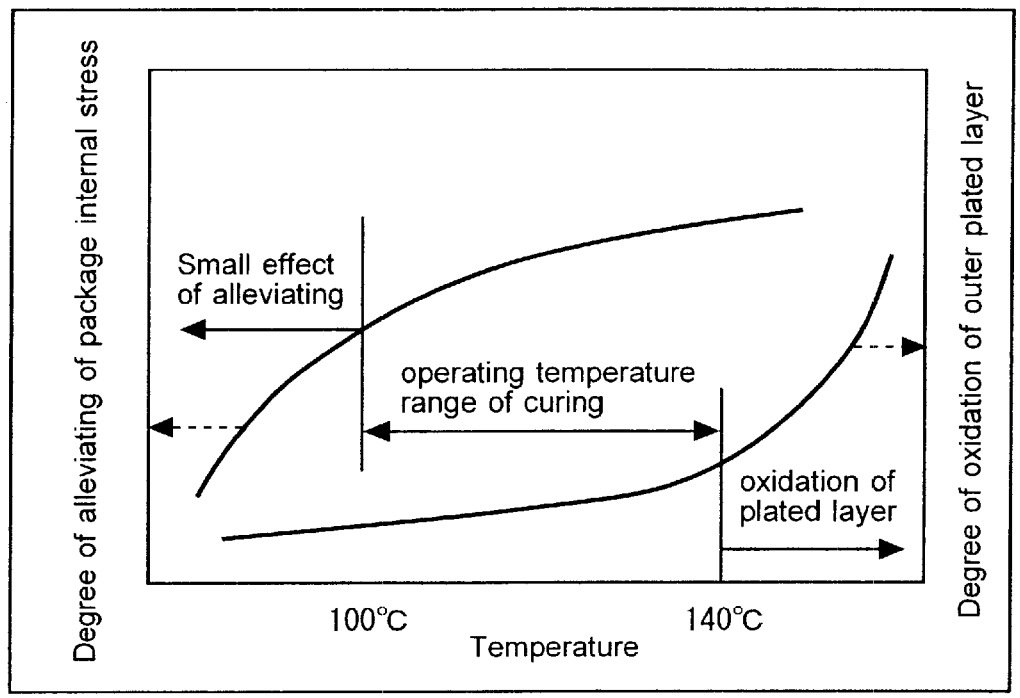
FIG. 9 is a graph showing a relationship between a curing temperature and a degree of alleviating of package internal stress and a relationship between a curing temperature and a degree of oxidation of outer plated layer.

The reason why the curing temperature is lower than that employed in the first embodiment (i.e., 175±10° C.) will now be described by reference to FIG. 9.

Solder used for plating usually has the melting point of about 180° C. As shown in FIG. 9, the higher the temperature, the greater the degree of oxidation of an outer plated layer. In order to prevent oxidation of the outer plated layer, the upper limit of curing temperature was set to 140° C., thus providing a margin.

Our experiments have shown that, when the package is cured at about 80° C., the package 2 is readily deformed by internal stress. As shown in FIG. 9, when curing temperature is low, the effect of alleviating internal stress becomes small. For this reason, the lower limit of curing temperature is set to 100° C., thus providing a margin.

As described, under the method of manufacturing a semiconductor device according to the second embodiment, a semiconductor element is molded, and the tie bars 4 are cut. After the leads 3 have been plated, the package 2 is subjected to heat treatment (curing treatment). According to this manufacturing method, the package can be brought into a less constrained state. The stress arising in the package 2 at the time of molding can be reduced by means of heat treatment (post curing treatment) in a state in which the package 2 is subjected to fewer constraints. The package 2 can be cooled to room temperature in a less constrained state.

Accordingly, warpage of the package 2 can be reduced, thereby improving the flatness of leads of the package 2. A highly-reliable semiconductor device can be manufactured, and manufacturing yield of the semiconductor device can be improved.

In the second embodiment, after the tie bars 4 have been cut, the pinching cut sections 5 are cut before the package 2 is subjected to heat treatment. As a result, internal stress in the package 2 can be further diminished by means of heat treatment, and the package 2 can be cooled to room temperature in a less constrained state.

In the second embodiment, the temperature of heat treatment to which the package 2 is to be subjected after cutting of the tie bars 4 is set to 100 to 140° C., which is lower than that employed in the first embodiment. This enables prevention of oxidation of plated layers formed on the surfaces of the leads 3.

An LQFP, which is a package having a length per side of 24 mm, was actually manufactured according to the foregoing manufacturing method. Warpage in the thus-manufactured package was measured. Measurement results are provided in Table 2.

TABLE 2

| MANUFACTURING METHOD | WARPAGE (μm) | | |
|---|---|---|---|
| | Max | Ave | Min |
| RELATED-ART METHOD | 77 | 61 | 5 |
| SECOND EMBODIMENT | 29 | 22 | 14 |

As shown in Table 2, in the manufacturing method according to the second embodiment, warpage of the package 2 could be diminished significantly as compared with the related-art manufacturing method.

An LQFP having a length per side of 20 mm was also subjected to the same measurement. Even in this case, it was ascertained that warpage in the package could be diminished, as in the case of the LQFP having a length per side of 24 mm.

Figure 10:
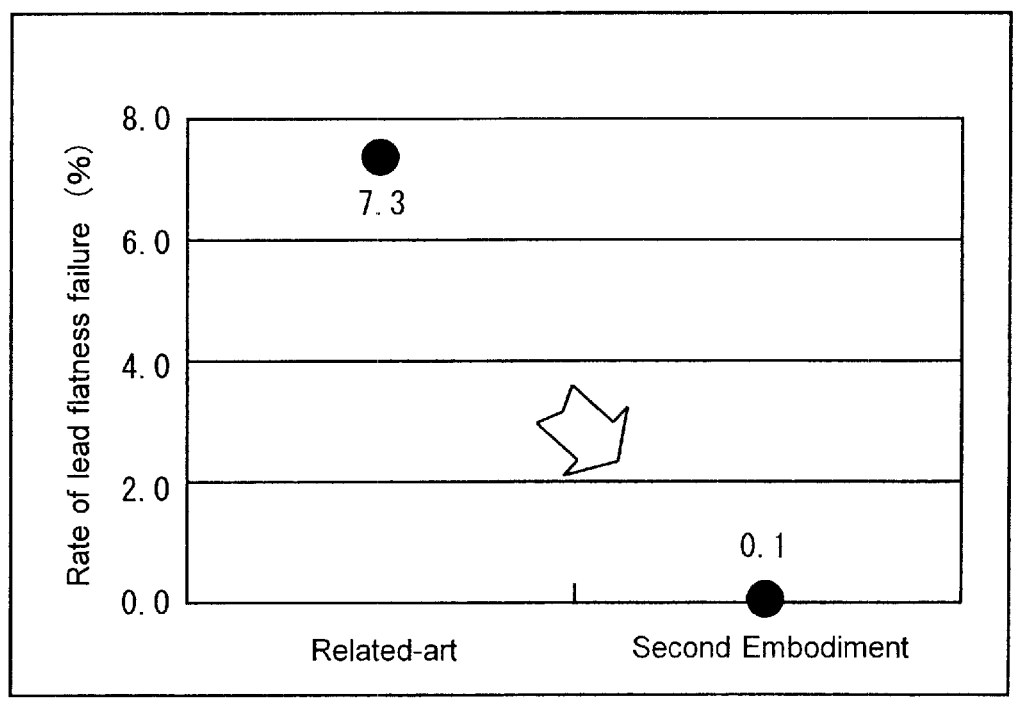
FIG. 10 is a graph showing a comparison between the package described in connection with the second embodiment and the related-art package, in terms of a rate of lead flatness failure.
Figure 13:
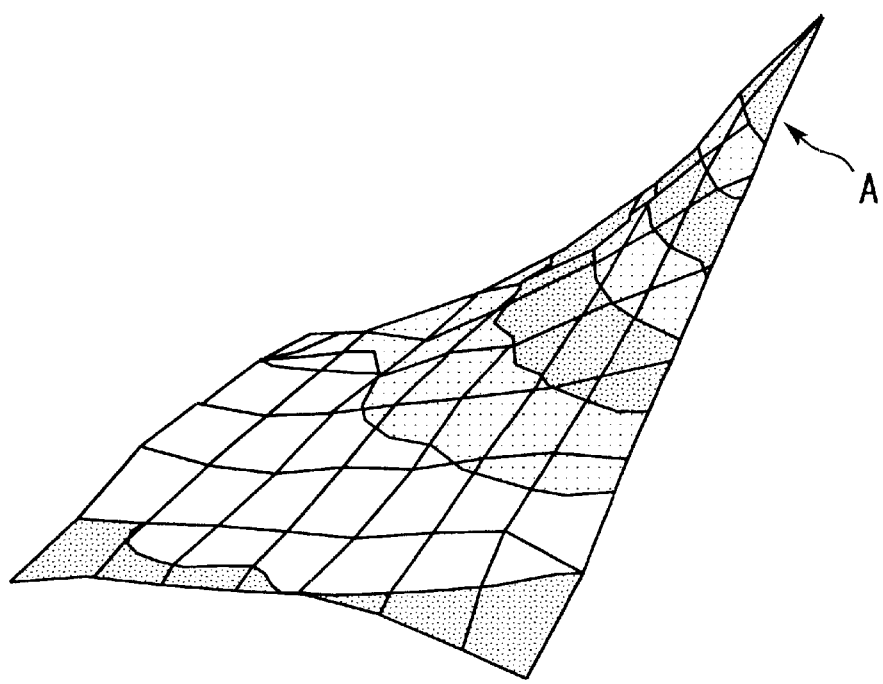
FIG. 13 is a view for describing a surface state of a package having flatness failure.
Figure 14:
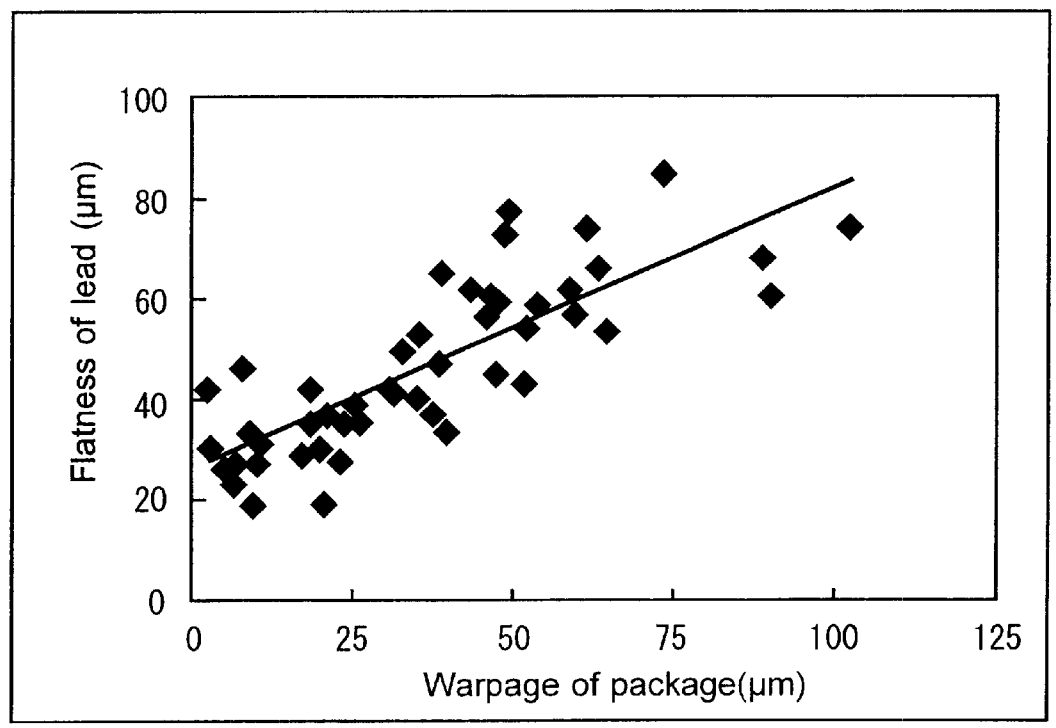
FIG. 14 is a graph showing a relationship between warpage of a package and the flatness of leads.
Figure 15:
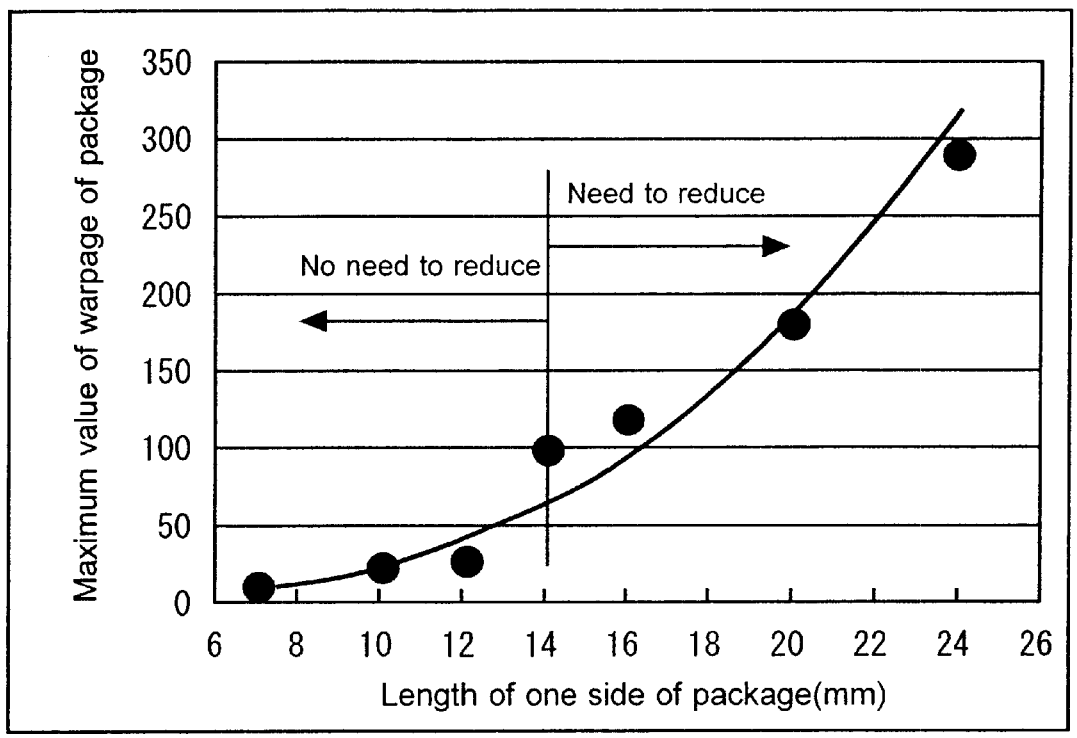
FIG. 15 is a graph showing a relationship between occurrence of warpage and the size of a package.

FIG. 10 is a graph showing a comparison between the package described in connection with the second embodiment and the related-art package, in terms of a rate of lead flatness failure. As shown in FIG. 10, a lead flatness failure rate of 7.3%, which has hitherto been obtained, could be reduced significantly to 0.1%.

Accordingly, the manufacturing method according to the second embodiment enables a reduction in warpage of a package and manufacture of a semiconductor device which is superior in terms of flatness of leads.

In the second embodiment, the pinch cutting sections 5 are cut after cutting of the tie bars 4. However, the pinching cut sections 5 may be cut simultaneously with cutting of the tie bars 4.

This invention, when practiced illustratively in the manner described above, provides the following major effects:

The present invention enables a reduction in warpage of a package and manufacture of a semiconductor device which is superior in flatness of leads.

Further, the present invention is not limited to these embodiments, but variations and modifications may be made without departing from the scope of the present invention.

The entire disclosure of Japanese Patent Application No. 2001-293418 filed on Sep. 26, 2001 containing specification, claims, drawings and summary are incorporated herein by reference in its entirety.

What is claimed is:

1. A method of manufacturing a semiconductor device comprising the steps of:

fixing a semiconductor element on a frame;

connecting the semiconductor element with a plurality of leads;

sealing the semiconductor element with molding resin, to thereby fabricate a package having a length per side of 14 mm or more;

cutting tie bars interconnecting the plurality of leads; and subjecting the package to heat treatment at a predetermined temperature after cutting of the tie bars.

2. The method of manufacturing a semiconductor device according to claim 1, wherein the package is subjected to the heat treatment in a state in which internal stress of the package can be alleviated.

3. The method of manufacturing a semiconductor device according to claim 1, wherein the predetermined temperature is 175° C.±10° C.

4. The method of manufacturing a semiconductor device according to claim 1, further comprising a step of plating the surfaces of the leads after cutting of the tie bars and before the package is subjected to the heat treatment.

5. The method of manufacturing a semiconductor device according to claim 1, wherein pinch cutting sections connecting corners of the package with a framework are cut simultaneously with cutting of the tie bars, or before the package is subjected to heat treatment but after cutting of the tie bars.

6. The method of manufacturing a semiconductor device according to claim 1, wherein the tie bars are provided at positions spaced 0.2 mm to 0.3 mm away from a mold line of the package and in parallel with the mold line.

7. The method of manufacturing a semiconductor device according to claim 1, wherein the tie bars are provided at positions spaced 1.7 mm away from a framework and in parallel with a mold line of the package.

8. The method of manufacturing a semiconductor device according to claim 1, wherein the package is a TQFP or LQFP.

9. The method of manufacturing a semiconductor device according to claim 1, wherein the frame is formed from copper or iron as a principal constituent.

* * * * *